United States Patent
Kato

(10) Patent No.: US 7,871,471 B2
(45) Date of Patent: Jan. 18, 2011

(54) SUBSTRATE PROCESSING APPARATUS INSPECTION METHOD AND METHOD FOR REDUCING QUANTITY OF PARTICLES ON SUBSTRATE

(75) Inventor: Yoshiyuki Kato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 393 days.

(21) Appl. No.: 12/023,316

(22) Filed: Jan. 31, 2008

(65) Prior Publication Data

US 2008/0213082 A1 Sep. 4, 2008

Related U.S. Application Data

(60) Provisional application No. 60/916,317, filed on May 7, 2007.

(30) Foreign Application Priority Data

Feb. 5, 2007 (JP) ............................. 2007-025688

(51) Int. Cl.
*B08B 7/00* (2006.01)
*H01L 21/302* (2006.01)

(52) U.S. Cl. ........................... 134/1.2; 134/26; 438/14; 438/689; 438/706; 438/734

(58) Field of Classification Search ........................ None
See application file for complete search history.

(56) References Cited

U.S. PATENT DOCUMENTS

| | | | |
|---|---|---|---|
| 2003/0022512 A1* | 1/2003 | Saito et al. ................... | 438/710 |
| 2003/0207579 A1* | 11/2003 | Rattner et al. ................ | 438/700 |
| 2004/0222383 A1* | 11/2004 | Kawakami ................... | 250/430 |
| 2005/0045276 A1* | 3/2005 | Patel et al. ............. | 156/345.43 |
| 2005/0090927 A1* | 4/2005 | Tanaka et al. ............... | 700/121 |

FOREIGN PATENT DOCUMENTS

JP 2006-179528 7/2006

\* cited by examiner

*Primary Examiner*—Michael Cleveland
*Assistant Examiner*—Nicole Blan
(74) *Attorney, Agent, or Firm*—Oblon, Spivak, McClelland, Maier & Neustadt, L.L.P.

(57) ABSTRACT

It is intended to prevent an increase in the quantity of particles on a test-piece substrate having undergone processing executed at a low temperature equal to or lower than 0° C. In an inspection method adopted when inspecting the state inside a processing chamber by measuring the quantity of particles on a test-piece substrate, i.e., a test-piece wafer, the test-piece wafer W having undergone a specific type of test processing inside the processing chamber is carried out into a transfer chamber via a loadlock chamber after holding it in the loadlock chamber over a predetermined length of time while delivering a dried inert gas into the loadlock chamber. The predetermined length of time is set to a value at which the increase in the quantity of particles on the test-piece wafer can be kept down at least within an acceptable range.

7 Claims, 9 Drawing Sheets

SUBSTRATE PROCESSING APPARATUS INSPECTION METHOD AND METHOD FOR REDUCING QUANTITY OF PARTICLES ON SUBSTRATE

CROSS-REFERENCE TO RELATED APPLICATIONS

This document claims priority to Japanese Patent Application Number 2007-025688, filed on Feb. 5, 2007 and U.S. Provisional Application No. 60/916,317, filed on May 7, 2007, the entire content of which are hereby incorporated by reference.

FIELD OF THE INVENTION

The present invention relates to a substrate processing apparatus inspection method that may be adopted when inspecting the state inside a processing chamber by measuring particles on a test-piece substrate and the method for reducing quantity of particles present on a substrate.

BACKGROUND OF THE INVENTION

A substrate processing apparatus that executes a specific type of processing such as etching or film formation on a substrate such as a glass substrate (e.g., a liquid crystal substrate) or a semiconductor wafer (hereafter may be simply referred to as a "wafer") includes a processing unit, achieved by connecting a loadlock chamber functioning as a relay chamber to a processing chamber where a wafer, for instance, undergoes the specific type of processing, and a transfer chamber through which a wafer is transferred (carried) into/out of the processing unit via a transfer mechanism such as a transfer arm.

In such a substrate processing apparatus, an unprocessed wafer stored in a cassette container is taken out and transferred over to the processing unit via the transfer mechanism at the transfer chamber. The unprocessed wafer is then carried into the processing chamber via the loadlock chamber and undergoes the specific type of processing such as etching in the processing chamber. Once the processing in the processing chamber ends, the processed wafer is carried back into the initial cassette container via the loadlock chamber from the processing chamber.

As the etching process or the like is executed on a wafer, particles constituted of reaction products or the like resulting from the etching process are generated inside the processing chamber. The particles adhering to the wafer cause shorting or the like in the wiring of the semiconductor devices manufactured by using the wafer, which ultimately leads to a poor yield. The quantity of particles adhering to the wafer changes depending upon the state and the like in each processing chamber. Accordingly, the state in the processing chamber must be inspected on a regular basis.

A method known in the related art for processing chamber state inspection executed by transferring a test-piece wafer, different from a product wafer, into an inspection target processing chamber and measuring the particles present on the test-piece wafer, has come to be adopted widely in recent years (e.g., see Japanese Laid Open Patent Publication No. 2006-179528).

However, it has been confirmed that depending upon the processing conditions under which the test-piece wafer is processed, the quantity of particles present on the test-piece wafer increases immediately after the processing or after a certain length of time elapses. For instance, if the test-piece wafer is processed at a low temperature equal to or lower than 0° C. (e.g., at −10° C. or lower), an increase in the quantity of particles assumed to be attributable to the moisture contained in the room air, occurs while the test-piece wafer is transferred from the loadlock chamber through the transfer chamber filled with room air.

The quantity of particles present on the test-piece wafer also increases immediately after the test-piece wafer is processed by using a processing gas containing a fluorocarbon gas and $N_2$ gas or after the test-piece wafer having undergone such processing is returned into the cassette container and is left in the cassette container over a specific length of time or longer.

Since these phenomena result in an overall increase in the quantity of particles present on the test-piece wafer undergoes particle measurement, the quantity of particles having become adhered onto the test-piece wafer while the test-piece wafer was processed cannot be accurately measure. Thus, the state inside the processing chamber (e.g., the quantity of particles inside the processing chamber) cannot be inspected accurately.

SUMMARY OF THE INVENTION

Accordingly, an object of the present invention, having been completed by addressing the issues discussed above, is to provide a substrate processing apparatus inspection method through which an increase in the particles on a substrate having undergone processing can be prevented and thus, the particles having become adhered onto the substrate due to the substrate processing can be measured accurately and a method for reducing quantity of particles on the substrate.

The object described above is achieved in an aspect of the present invention by providing a substrate processing apparatus inspection method to be adopted in a substrate processing apparatus comprising a processing chamber where a specific type of processing is executed on a substrate placed on a stage with the temperature thereof set at a low level equal to or lower than 0° C. in a low pressure environment, a loadlock chamber connected to the processing chamber and a transfer chamber connected to the loadlock chamber, through which the substrate is transferred in an environment at one atmosphere, when inspecting the state inside the processing chamber by measuring particles on a test-piece substrate having undergone a specific type of test processing inside the processing chamber. The substrate processing apparatus inspection method is characterized in that the test-piece substrate having been processed in the processing chamber is transferred back into the transfer chamber via the loadlock chamber after holding the test-piece substrate in the loadlock chamber over a predetermined length of time while delivering a dried inert gas into the loadlock chamber and that the predetermined length of time is set to a length of time over which an increase in the particles on the test-piece substrate can be kept within an acceptable range (e.g., at least 25 seconds or longer). It is to be noted that the temperature of the stage may be set to, for instance, −10° C. or lower and that the inert gas may be, for instance, $N_2$ gas.

According to the present invention described above, the increase in the particles present on the test-piece substrate having undergone the processing executed at a low temperature of 0° C. or lower can be minimized. Since this enables accurate measurement of the particles adhered onto the test-piece substrate while the test-piece substrate undergoes the processing, the state inside the processing chamber can be ascertained with great accuracy.

It is desirable that if the test processing is executed by using a processing gas containing at least a fluorocarbon gas and $N_2$ gas, a treatment process be executed immediately after the test processing, by using a processing gas containing a fluorocarbon gas (e.g., $CF_4$ gas) with no $N_2$ gas content. These measures prevent an increase in the quantity of particles on the test-piece substrate immediately after the test processing executed on the test-piece substrate by using the processing gas containing the fluorocarbon gas and the $N_2$ gas or after the test-piece substrate having been returned into the cassette container is left in the cassette container over a specific length of time or longer. As a result, the quantity of particles having become adhered onto the substrate through the test processing executed in the processing chamber can be measured accurately and thus, the state inside the processing chamber can be inspected with a high level of accuracy.

The object described above is also achieved in another aspect of the present invention by providing a method for reducing quantity of particles on a substrate, to be adopted in a substrate processing apparatus that includes a processing chamber where a specific type of plasma processing is executed on a substrate placed on a lower electrode with the temperature thereof set at a low level of 0° C. or lower by supplying high-frequency power to the lower electrode within a low pressure atmosphere, when reducing the quantity of particles on the substrate having undergone the plasma processing executed with a processing gas containing at least a fluorocarbon gas and $N_2$ gas. The method is characterized in that a treatment process is executed by using a processing gas containing a fluorocarbon gas (e.g., a $CF_4$ gas) with no $N_2$ gas content immediately after the specific type of processing executed in the processing chamber.

According to the present invention described above, an increase in the quantity of particles on the substrate immediately after the processing executed on the substrate by using the processing gas containing the fluorocarbon gas and the $N_2$ gas or after the substrate having been returned into the cassette container is left in the cassette container over a specific length of time or longer is prevented. As a result, the quantity of particles having become adhered onto the substrate through the processing executed in the processing chamber can be measured accurately.

In addition, it is desirable that the pressure inside the processing chamber and the high-frequency power applied to the lower electrode during the treatment process be set by ensuring that the substrate does not become etched. By selecting such conditions, it is ensured that the substrate does not become damaged during the treatment process.

The present invention provides a substrate processing apparatus inspection method that enables accurate measurement of the quantity of particles having become adhered onto a substrate having undergone processing by preventing an increase in the quantity of particles on the substrate from occurring after the substrate processing and a method for reducing the quantity of particles on the substrate.

DETAILED DESCRIPTION OF THE PREFERRED EMBODIMENT

Figure 1:
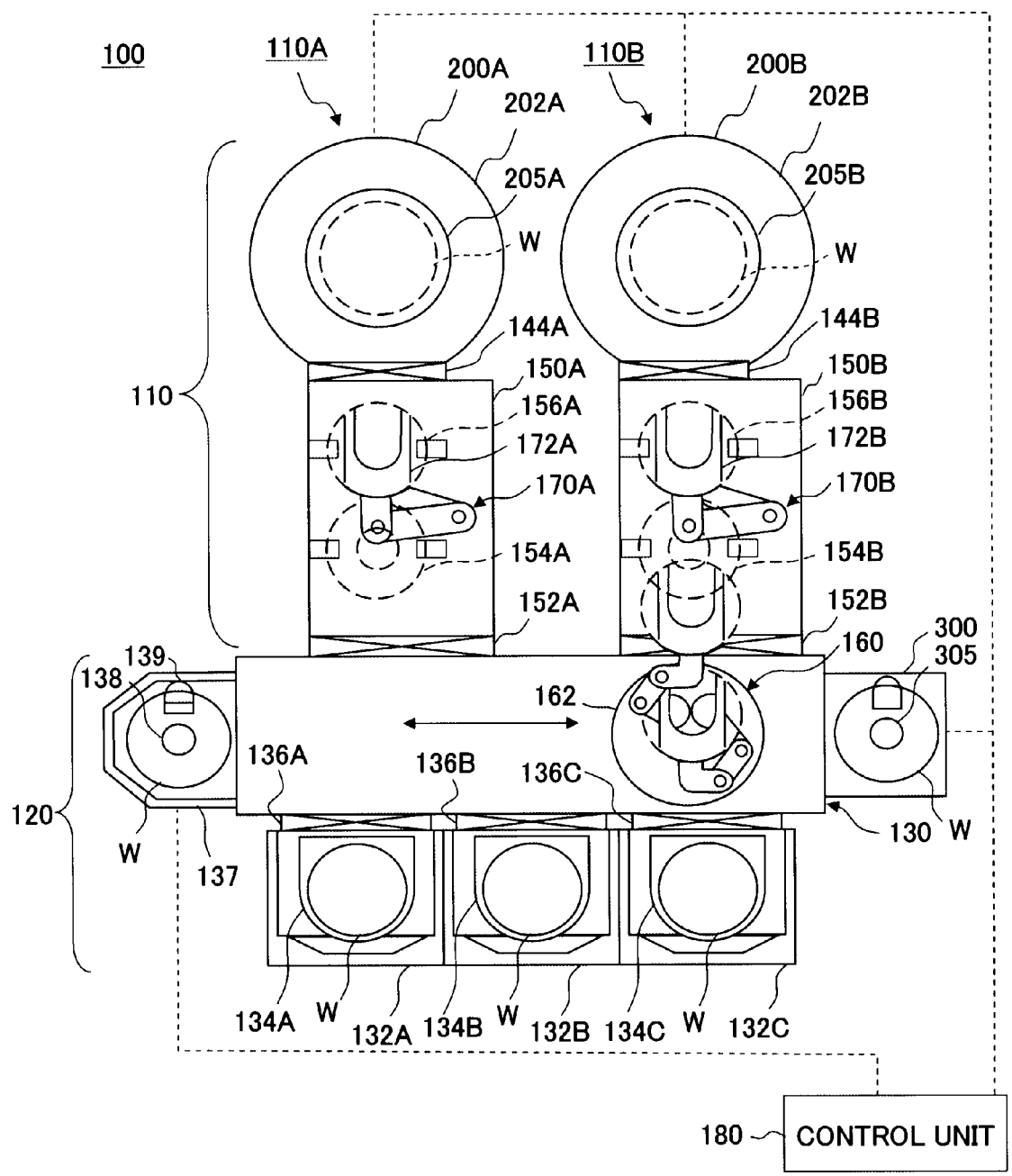
FIG. 1 is a sectional view presenting a structural example for a substrate processing apparatus that may adopt the present invention.

The following is a detailed explanation of the preferred embodiment of the present invention, given in reference to the attached drawings. It is to be noted that in the specification and the drawings, the same reference numerals are assigned to components having substantially identical functions and structural features to preclude the necessity for a repeated explanation thereof.

(Structural Example for Substrate Processing Apparatus)

First, a structural example that may be adopted in the substrate processing apparatus in an embodiment of the present invention is explained in reference to a drawing. The substrate processing apparatus in this example includes at least one vacuum processing unit connected to a transfer chamber. FIG. 1 is a sectional view schematically illustrating the structure of the substrate processing apparatus achieved in the embodiment.

The substrate processing apparatus 100 includes either a single vacuum processing unit 110 or a plurality of vacuum processing units 110 where a specific type of processing such as etching are executed on a substrate, e.g., a semiconductor wafer (hereafter may be simply referred to as "wafer") W, and a transfer unit 120 that transfers the wafer W into/out of each vacuum processing unit 110. The transfer unit 120 includes a transfer chamber 130 used to transfer wafers W.

In the example presented in FIG. 1, two vacuum processing units 110A and 110B are disposed along a side surface of the transfer unit 120. The vacuum processing units 110A and 110B respectively include plasma processing devices 200A and 200B and evacuatable load-lock chambers 150A and 150B functioning as relay chambers and disposed continuous to the plasma processing devices. In the plasma processing devices 200A and 200B of the vacuum processing units 110A and 110B, a single type of processing such as etching is executed on wafers W.

The plasma processing devices 200A and 200B may respectively include processing chambers 202A and 202B. The surfaces of wafers placed on lower electrodes 205A and 205B disposed inside the respective processing chambers and used as wafer stages are etched with plasma generated by applying high-frequency power to the lower electrodes 205A and 205B and supplying a processing gas into the processing chambers 202A and 202B. At least either the plasma processing device 200A or the plasma processing device 200B assumes a structure enabling low-temperature (e.g., 0° C. or lower) etching in the embodiment. A specific example of a structure that may be assumed in a plasma processing device capable of etching wafers at a low temperature equaled to or lower than 0° C. is to be described in detail later.

It is to be noted that while the example presented in FIG. 1 includes two vacuum processing units each equipped with a plasma processing device, the present invention is not limited to this example and there may be three or more vacuum processing units each equipped with a plasma processing device. In addition, it is not essential that each vacuum processing unit be equipped with a plasma processing device and instead, the substrate processing apparatus may include a vacuum processing unit equipped with a plasma processing device and a vacuum processing unit equipped with a processing device (e.g., a heat treatment device) other than a plasma processing device.

The transfer chamber 130 at the transfer unit 120 is formed as a box with a substantially rectangular section, where an inert gas such as $N_2$ gas or clean air is circulated. A plurality of cassette stages 132A through 132C are disposed side-by-side at one of the side surfaces of the transfer chamber 130 ranging along the longer side of the substantially rectangular section. The cassette stages 132A through 132C function as substrate standby ports, at which cassette containers 134A through 134C are placed. While FIG. 1 shows three cassette containers 134A through 134C each placed on one of the cassette stages 132A through 132C, the numbers of the cassette stages and the cassette containers are not limited to this example and there may be one or two cassette stages and cassette containers, or there may be four or more cassette stages and cassette containers.

At each of the cassette containers 134A through 134C, up to 25 wafers W can be stored in multiple racks with equal pitches. The cassette containers assume a sealed structure with, for instance, an $N_2$ gas atmosphere filling the space therein. Wafers W can be carried into/out of the transfer chamber 130 via gate valves 136A through 136C.

A common transfer mechanism (atmospheric pressure-side transfer mechanism) 160 that transfers a wafer W along the length (along the direction indicated by the arrow in FIG. 1) thereof is disposed inside the transfer chamber 130. The common transfer mechanism 160 is fixed onto, for instance, a base 162 and the base 162 is allowed to slide on a guide rail (not shown) disposed over the central area of the transfer chamber 130 so as to extend along the length thereof via, for instance, a linear motor drive mechanism. The common transfer mechanism 160 may be a double-arm mechanism equipped with two end effectors, as shown in FIG. 1, or it may be a single-arm mechanism equipped with a single end effector.

At the other side surface of the transfer chamber ranging along the longer side of the substantially rectangular section, the base ends of the two load-lock chambers 150A and 150B are connected via switchable gate valves (atmospheric pressure-side gate valves) 152A and 152B. The front ends of the load-lock chambers 150A and 150B are respectively connected to the processing chambers 202A and 202B via switchable gate valves (vacuum pressure-side gate valves) 144A and 144B.

In the load-lock chambers 150A and 150B, a pair of buffer stages 154A and 156A and a pair of buffer stages 154B and 156B, on which wafers W are temporarily held in standby, are respectively disposed. In the explanation, the buffer stages 154A and 154B disposed closer to the transfer chamber 130 are referred to as first buffer stages, whereas the buffer stages 156A and 156B disposed on the other side are referred to as second buffer stages. Individual transfer mechanisms (vacuum pressure-side transfer mechanisms) 170A and 170B, each constituted with an articulated arm capable of articulating, rotating and moving up/down, are disposed respectively between the buffer stages 154A and 156A and between the buffer stages 154B and 156B.

At the front ends of the individual transfer mechanisms 170A and 170B, end effectors 172A and 172B are respectively disposed, so that wafers W can be transferred between the first and second buffer stages 154A and 156A and between the first and second buffer stages 154B and 156B via the end effectors 172A and 172B respectively. It is to be noted that wafers are carried from the load-lock chambers 150A and 150B to the processing chambers 202A and 202B and vice versa via the respective individual transfer mechanisms 170A and 170B.

At one end of the transfer chamber 130, i.e., at one of the side surfaces ranging along the shorter side of the substantially rectangular section of the transfer chamber 130, an orienter (pre-alignment stage) 137 engaged in operation when positioning the wafer W is disposed. The orienter 137, which includes a rotary stage 138 and an optical sensor 139 for optically detecting the circumferential edge of the wafer W, positions the wafer W by detecting an orientation flat, a notch or the like at the wafer W.

At the other end of the transfer chamber 130, i.e., at the other side surface ranging along the shorter side of the substantially rectangular section of the transfer chamber 130, a measurement chamber 300 is disposed. The measurement chamber 300 in the embodiment functions as a particle measurement chamber (particle monitor) where the quantity of particles e.g., deposit, adhering to a wafer W placed on a stage 305 disposed therein is measured. It is to be noted that the measurement chamber 300 may adopt a structure of the known art and accordingly, a detailed explanation of its structure is omitted.

The particle quantity measurement target wafer W is carried into the measurement chamber 300 via the common transfer mechanism 160 and the quantity of particles adhering to the wafer W is directly measured in the measurement chamber 300.

The individual units including the processing chambers 202A and 202B, the measurement chamber 300, the orienter 137, the transfer mechanisms 160 and 170 are controlled based upon control signals provided by a control unit 180. The wafer processing is executed as the control unit 180 controls the various units based upon a specific program. In addition, the measurement results indicating the quantity of particles provided from the measurement chamber 300 are transmitted to the control unit 180 where they are stored into a storage means such as a memory installed within the control unit 180. Based upon the particle quantity ascertained through the measurement executed in the measurement chamber 300, the control unit 180 detects the state inside the target processing chamber and then is able to adjust the processing conditions under which the next wafer processing is to be executed in the particular processing chamber or indicate the timing with which the processing chamber should be cleaned in correspondence to the detected processing chamber state.

(Example for Gas Piping Structure in the Load-Lock Chambers0

Figure 2:
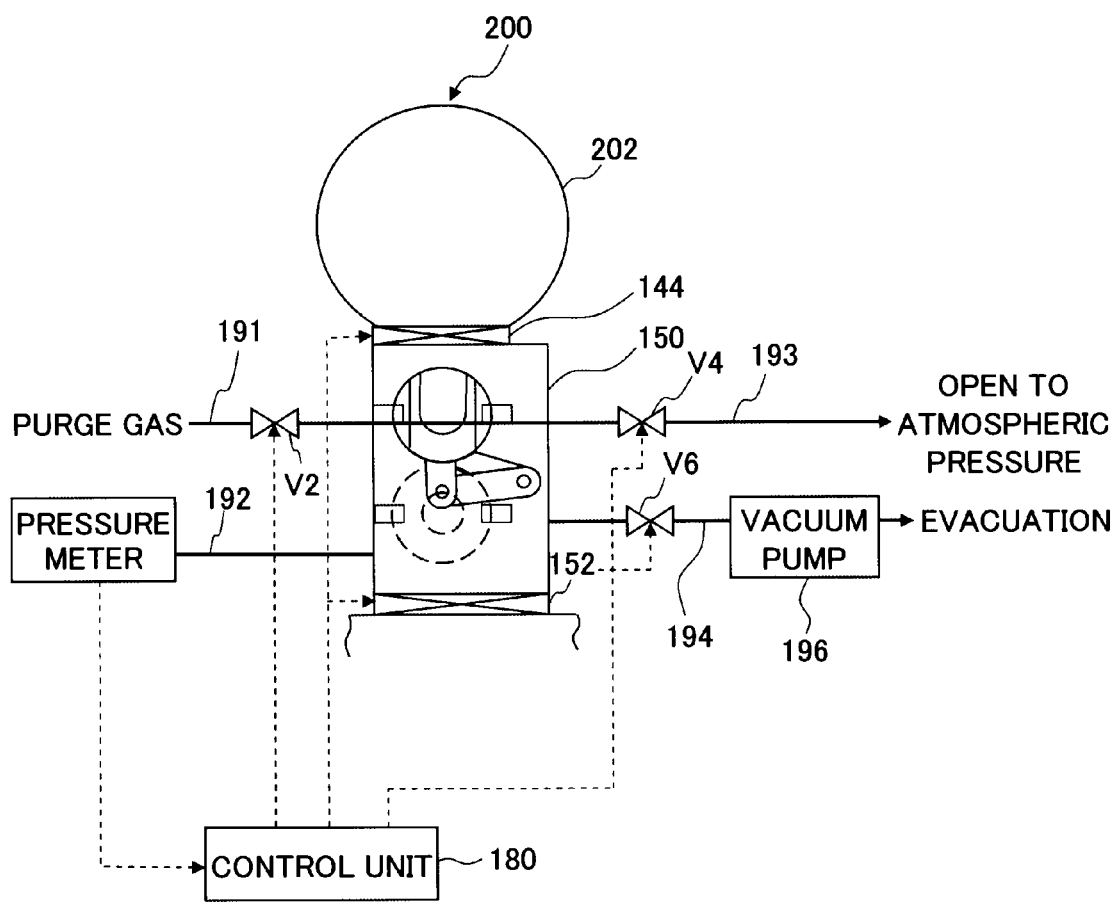
FIG. 2 is a sectional view schematically illustrating the gas piping structure that may be adopted in the loadlock chambers in FIG. 1.

Next, the gas piping structure assumed in the loadlock chambers at the vacuum processing units is described in reference to a drawing. FIG. 2 schematically illustrates the gas piping structure adopted in the loadlock chambers. Since the loadlock chambers 150A and 150B in FIG. 1 assume gas piping structures identical to each other, the following explanation is provided in reference to a loadlock chamber 150 representing both loadlock chambers 150A and 150B.

An inert gas delivery system is disposed on the gas supply side (e.g., at the top or the side of the loadlock chamber 150) of the loadlock chamber 150. This inert gas delivery system includes a purge gas supply pipe 191 through which an inert gas (e.g., Ar gas or $N_2$ gas) to be used as a purge gas is supplied into the loadlock chamber 150. A control valve (purge valve) V2 to function as a gas delivery valve is present at the purge gas supply pipe 191.

In addition, a pressure meter that detects the atmospheric pressure state (760 mT) is connected via a piping 192 on the gas supply side of the loadlock chamber 150. The pressure meter may be, for instance, a pirani gauge.

A room air opening system is disposed on the discharge side (e.g., the bottom of the loadlock chamber 150) of the loadlock chamber 150. The room air opening system includes a relief pipe (room air communicating pipe) 193 that communicates between the internal space of the loadlock chamber 150 and the room air via a relief valve (room air opening valve) V4. It is to be noted that although not shown, the relief pipe (room air opening pipe) is connected between the loadlock chamber 150 and the relief valve V4 via a control valve used to adjust the flow rate at an air supply pipe through which air to be used for purposes of an air purge is supplied.

In addition, an evacuation system is disposed on the discharge side of the loadlock chamber 150. The evacuation system includes an evacuation pipe 194 through which the loadlock chamber 150 is evacuated. A discharge valve V6 is disposed at the evacuation pipe 194 and the discharge valve is connected to a vacuum pump 196 which may be, for instance, a dry pump.

As the control valves V2, V4, V6 are controlled via, for instance, the control unit 180, the pressure inside the loadlock chamber 150 is regulated. This pressure control is achieved through, for instance, room air charge (atmospheric pressure recovery) as the gate valve 152 at the loadlock chamber 150 on the atmospheric pressure side is opened.

(Structural Example for Plasma Processing Devices)

Figure 3:
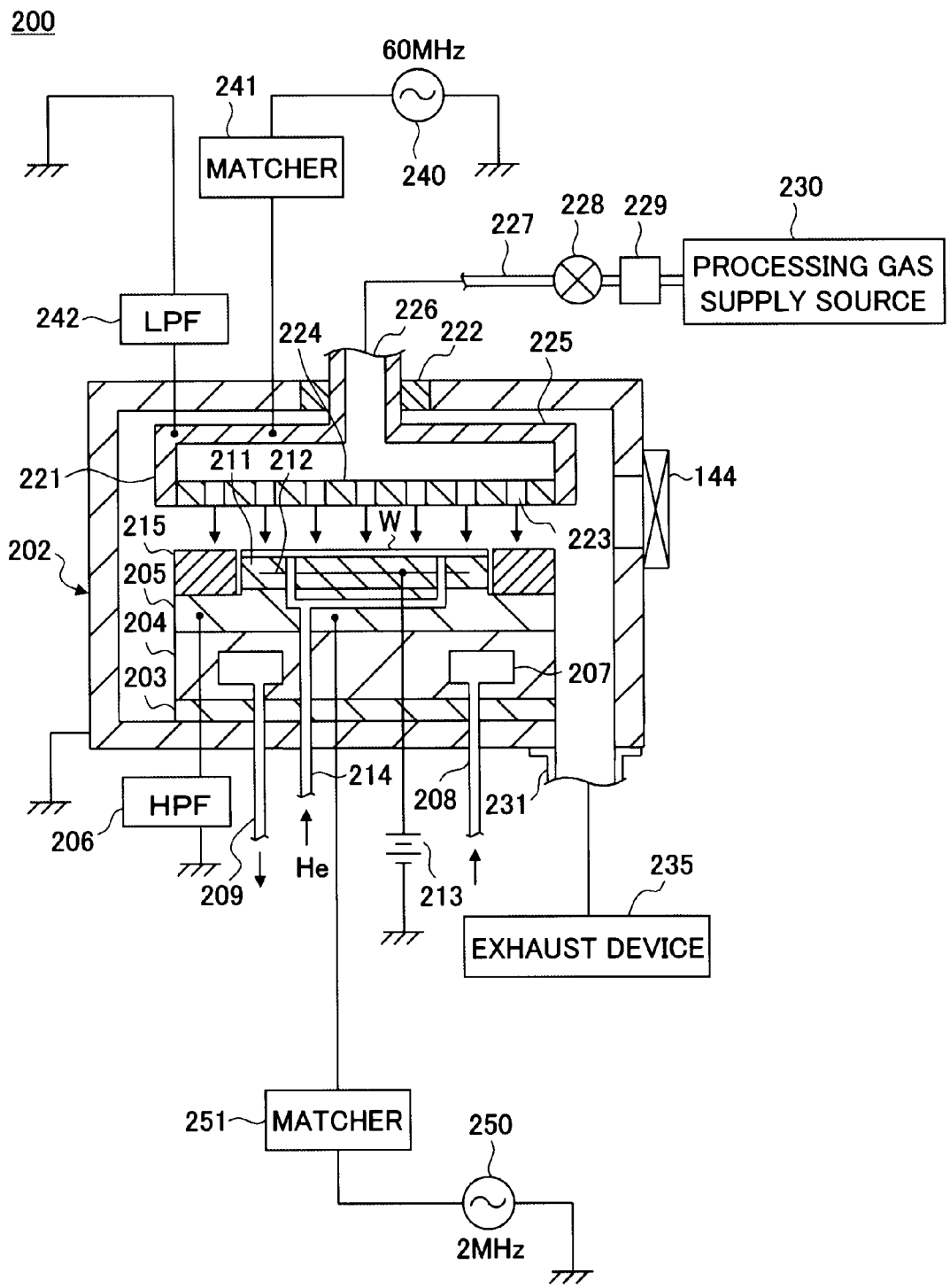
FIG. 3 is a sectional view schematically illustrating the structure adopted in the plasma processing devices in FIG. 1.

Next, a structural example for the plasma processing devices 200A and 200B is described in reference to a drawing. It is to be noted that since the plasma processing devices 200A and 200B in the substrate processing apparatus 100 achieved in the embodiment assume structures identical to each other, the following explanation is provided on a processing chamber 202 representing both the processing chamber 202A and the processing chamber 202B. FIG. 3 is a sectional view schematically illustrating the structure of the plasma processing device 200. The plasma processing device 200 is a plane-parallel plasma processing device capable of etching substrates at a low temperature of 0° C. or lower (e.g., −10° C.) or lower.

As shown in FIG. 3, the plasma processing device 200 includes a processing chamber 202 constituted with a cylindrical processing container constituted of anodized aluminum (having an anodic oxide coating). The processing chamber 202 is grounded. A support base 204 assuming a substantially circular column shape, on which a wafer W is placed, is disposed at the bottom within the processing chamber 202 via an insulating plate 203 constituted of ceramic or the like. A lower electrode (susceptor) 205 is disposed on the support base 204. A high pass filter (HPF) 206 is connected to the lower electrode 205.

A cooling chamber 207 is formed inside the support base 204. A coolant sustaining a low temperature equal to or lower than 0° C. (e.g., −10° C. or lower) delivered into the coolant chamber 207 via a delivery pipe 208 circulates through the coolant chamber and is then discharged through a discharge pipe 209. As the coolant circulates through the coolant chamber, the temperature of the lower electrode 205 is controlled at a desired level (e.g., −10° C.).

The lower electrode 205 is formed in a disk shape with a projecting center on its upper side and an electrostatic chuck 211 assuming a shape substantially identical to that of the wafer W is disposed on top of the lower electrode. The electrostatic chuck 211 includes an electrode 212 enclosed in an insulator. A DC voltage of 1.5 kV, for instance, is applied to the electrostatic chuck 211 from a DC power source 213 connected to the electrode 212. The wafer W is thus electrostatically held fast to the electrostatic chuck 211.

A gas passage 214 through which a heat transfer medium (e.g., a backside gas such as Ha gas) is supplied to the back surface of the processing target piece, i.e., the wafer W, is formed so as to range over the insulating plate 203, the support base 204, the lower electrode 205 and the electrostatic chuck 211. Heat is transferred between the lower electrode 205 and the wafer W via the heat transfer medium and, as a result, the temperature of the wafer W is sustained at a specific level (e.g., −10° C.).

An annular focus ring 215 is disposed so as to enclose the wafer W placed on the electrostatic chuck 211 at the upper end edge of the lower electrode 205. The focus ring 215 may be constituted of an insulating material such as ceramic or quartz or it may be constituted of an electrically conductive material. Better etching uniformity is assured with the presence of the focus ring 215.

An upper electrode 221 is disposed above the lower electrode 205 so as to face the lower electrode 205 by ranging parallel to the lower electrode. The upper electrode 221 is supported inside the processing chamber 202 via an insulator 222. The upper electrode 221 includes an electrode plate 224 constituting a surface thereof facing opposite the lower electrode 205 with numerous outlet holes 223 formed therein and an electrode support member 225 that supports the electrode plate 224. The electrode plate 224 may be constituted of, for instance, quartz, whereas the electrode support member 225 may be constituted of an electrically conductive material such as anodized aluminum. It is to be noted that the distance between the lower electrode 205 and the upper electrode 221 is adjustable.

A gas delivery port 226 is set at the center of the electrode support member 225 at the upper electrode 221. A gas supply pipe 227 is connected to the gas delivery port 226. In addition, a processing gas supply source 230 is connected via a valve 228 and a mass flow controller 229 to the gas supply pipe 227.

The etching gas to be used in the plasma etching process is supplied from the processing gas supply source 230. It is to be noted that while FIG. 3 shows a single processing gas supply system constituted with the gas supply pipe 227, the valve 228, the mass flow controller 229, the processing gas supply source 230 and the like, the plasma processing device 200 actually includes a plurality of such processing gas supply systems. The various gases constituting the processing gas, e.g., $CF_4$, $CHF_3$, $C_4F_8$, Ar and $N_2$, are supplied into the processing chamber 202 with their flow rates controlled independently of one another.

An exhaust pipe 231 is connected to the bottom of the processing chamber 202, with an exhaust device 235 connected to the exhaust pipe 231. The exhaust device 235 includes a vacuum pump such as a turbo molecular pump with which the pressure inside the processing chamber 202 is adjusted to a predetermined low level (e.g., 0.67 Pa or lower).

A first high-frequency power source 240 is connected to the upper electrode 221 with a first matcher 241 disposed at the power feed line from the first high-frequency power source. In addition, a low pass filter (LPF) 242 is connected to the upper electrode 221. The first high-frequency power source 240 is capable of outputting power with a frequency in the range of 50~150 MHz. As such high-frequency power is applied to the upper electrode 221, high-density plasma achieving a desirable state of dissociation is formed inside the processing chamber 202 and, as a result, plasma processing can be executed at a lower temperature (e.g., 0° C. or lower) than in the related art. It is desirable that the frequency of the power output from the first high-frequency power source 140 be in a range of 50~80 MHz, and most typically, the frequency is adjusted to 60 MHz, as shown in the figure or to a frequency close to 60 MHz.

A second high-frequency power source 250 is connected to the lower electrode 205 with a second matcher 251 disposed at the power feed line from the first high-frequency power source. The second high-frequency power source 250 is capable of outputting power with a frequency in a range several hundred kHz~several tens of MHz. As power with a frequency in this range is applied to the lower electrode 205, optimal ionization can be achieved without damaging the processing target, i.e., the wafer W. The frequency of the power output from the second high-frequency power source 250 is typically adjusted to 2 MHz as shown in the figure, 13.56 MHz or the like.

(Operations of the Substrate Processing Apparatus)

The operations executed by the substrate processing apparatus 100 structured as described above are now explained. The substrate processing apparatus 100 engaged in an etching process executed at a low temperature of 0° C. or lower (e.g., −10° C. or lower) in the processing chamber 202A on a product wafer W stored in, for instance, the cassette container 134A, operates as follows. Namely, the processing target product wafer is first taken out of the cassette container 134A by the common transfer mechanism 160 and then carried to the orienter 137 where it is transferred onto the rotary stage 138 of the orienter 137 for positioning.

The product wafer having undergone the positioning process is taken back onto the common transfer mechanism 160 and is carried on the common transfer mechanism to an entrance point to the loadlock chamber 150A where the product wafer is to undergo processing. As the gate valve 152A opens, the product wafer held on the common transfer mechanism 160 is carried from the transfer chamber 130 into the loadlock chamber 150A. Once the product wafer is carried into the loadlock chamber 150A, the gate valve 152A closes and the pressure in the loadlock chamber is adjusted.

As the pressure inside the loadlock chamber 150A is adjusted to a predetermined degree of vacuum and then the gate valve 144A opens, the product wafer in the loadlock chamber 150A is carried into the processing chamber 202A via the individual transfer mechanism 170A and is placed onto the lower electrode 205A. Once the product wafer is carried into the processing chamber 202A, the gate valve 144A closes and the etching process on the product wafer starts in the processing chamber 202A.

In more specific terms, the pressure inside the processing chamber 202A is held so as to sustain a predetermined degree of vacuum and the temperature of the lower electrode 205A is controlled at, for instance, −10° C. with coolant. A specific processing gas (e.g., $CF_4$ or $CHF_3$) is delivered into the processing chamber in this state and the specific high-frequency power is applied to the upper electrode and the lower electrode. As a result, plasma is generated from the processing gas and the product wafer is etched with the plasma.

Once the processing on the product wafer ends in the processing chamber 202A and the gate valve 144A opens, the product wafer having undergone the processing is carried out into the loadlock chamber 150A via the individual transfer mechanism 170A. Once the product wafer is carried out into the loadlock chamber 150A, the gate valve 144A closes and then, the product wafer is carried out into the transfer chamber 130. Namely, after the processed product wafer is carried into the loadlock chamber 150A, the gate valve 152A opens so that the product wafer can be carried out of the loadlock chamber 150A into the transfer chamber 130 via the common transfer mechanism 160 and then the gate valve 152A closes.

As the product wafer undergoes the etching process, as described above, particles constituted of reaction products resulting from the etching process and the like are formed inside the processing chamber 202. The particles adhering to the product wafer cause shorting and the like in the wiring of the semiconductor devices manufactured by using the product wafer, which ultimately leads to a poor yield. The quantity of particles adhering to the product wafer changes depending upon the state and the like in the processing chamber. Accordingly, the state in the processing chamber must be inspected on a regular basis. The processing chamber state inspection may be executed through, for instance, test processing referred to as QC (quality control) check processing.

As the substrate processing apparatus 100 is switched from a regular mode for executing the product wafer processing to a QC check mode for executing the QC check processing via an operation panel of the substrate processing apparatus, the QC check processing becomes enabled.

The QC check processing is executed by setting a cassette container containing test-piece wafers (e.g., bare silicon wafers with the entire wafer surfaces constituted of silicon) to be used as test-piece substrates different from product wafers on a cassette stage. A test-piece wafer taken out of the cassette container is carried to the inspection target processing chamber 202 via the orienter 137 and the loadlock chamber 150 as would a product wafer, as described earlier, and once it is carried into the processing chamber 202, it undergoes a specific type of test processing.

As the test processing, processing similar to that executed on the product wafer may be executed. Namely, in this example, the pressure inside the processing chamber 202 is sustained at a predetermined degree of vacuum and the temperature of the lower electrode 205 is controlled at a low level of 0° C. or lower (e.g., −10° C.) via the coolant. In this state, a specific processing gas (e.g., $CF_4$, $CHF_3$ or the like) is delivered into the processing chamber and the specific high-frequency power is applied to the upper electrode 221 and the lower electrode 205. The resulting plasma formed from the processing gas is used in the test processing executed on the test-piece wafer. The test-piece wafer having undergone the test processing is then carried into the transfer chamber 130 via the loadlock chamber 150, as would a product wafer, as explained earlier.

The test-piece wafer is then carried into the measurement chamber 300 where it undergoes particle measurement before it is taken back into the initial cassette container. It is to be noted that instead of carrying the test-piece wafer having undergone the test processing into the measurement chamber 300, the test-piece wafer may be directly carried back into the initial cassette container and then may be taken into the measurement chamber 300 for particle measurement when a predetermined length of time elapses.

Figure 4:
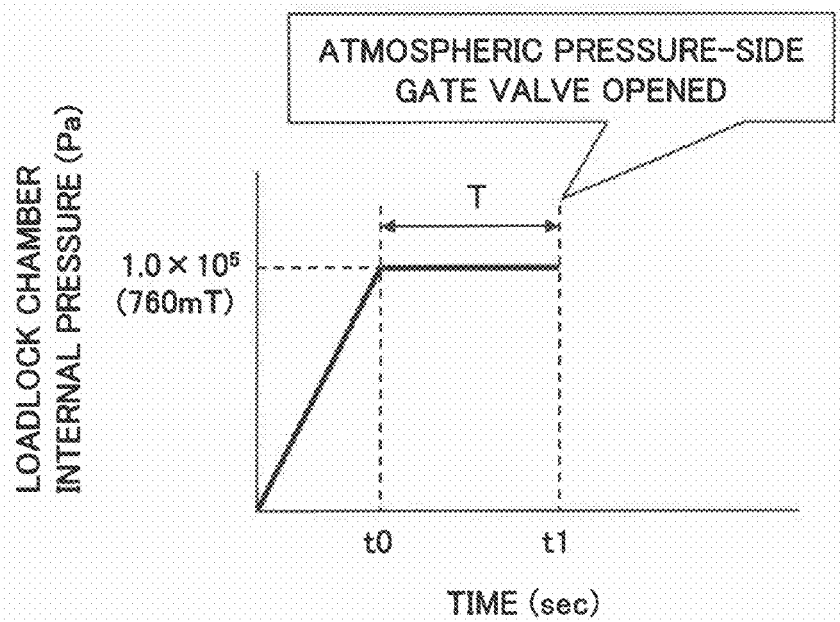
FIG. 4 presents a graph of a change in the loadlock chamber internal pressure.

When carrying the wafer W back-and-forth between the loadlock chamber 150 and the transfer chamber 130 filled with room air during the operation described above, pressure adjustment is executed for the loadlock chamber 150 by purging the loadlock chamber 150 with an inert gas (e.g., $N_2$ gas) before opening the atmospheric pressure-side gate valve 152. The pressure change in the loadlock chamber at this time is graphed in FIG. 4. FIG. 4 presents a graph of the pressure inside the loadlock chamber 150, which starts to change as the loadlock chamber is purged with the inert gas (e.g. $N_2$ gas).

More specifically, the inert gas such as $N_2$ gas is delivered into the loadlock chamber 150 by opening the control valve (purge valve) V2, as shown in FIG. 2, thereby starting the purge of the loadlock chamber 150. As the purge starts, the pressure inside the loadlock chamber 150 begins to rise as shown in FIG. 4. A decision is then made by using the pressure meter (e.g., a pirani gauge) as to whether or not the loadlock chamber 150 has achieved a pressure of 1 atmosphere. The loadlock chamber 150 may be determined to have achieved a pressure of 1 atmosphere at a time point t0, at which the reading on the pressure meter indicates a pressure of 760 mTorr: $1.0 \times 10^5$ Pa), as shown in FIG. 4.

Once the loadlock chamber 150 is judged to have achieved a pressure of 1 atmosphere, the relief valve V4 is opened after a predetermined length of time elapses following the time point t0 at which the loadlock chamber achieved a pressure of 1 atmosphere, so as to place the loadlock chamber 150 in communication with the room air. Subsequently, the delivery of purge gas is stopped by closing the control valve (purge valve) V2 after a predetermined length of purge delay time T elapses (e.g., 9 sec in FIG. 4) following the time point t0 at which the loadlock chamber achieved a pressure of 1 atmosphere, and the atmospheric pressure-side gate valve 152 is opened.

(Test Processing Executed at Low Temperature and Increase in Particles On Test-Piece Wafer)

The testing conducted by the inventor of the present invention et al. has confirmed that when a test-piece wafer undergoes test processing at a low temperature of 0° C. or lower (e.g., −10° C. or lower) as a product wafer would undergo wafer processing, an increase in the particles presumably attributable to the moisture in the room air occurs while the test-piece wafer is carried out of the loadlock chamber 150 into the transfer chamber 130 filled with the room air and then is carried into the measurement chamber 300. Since this phenomenon results in an overall increase in the quantity of particles present on the test-piece wafer, the quantity of particles having become adhered onto the test-piece wafer while the test-piece wafer was being processed cannot be accurately measured and thus, the state inside the processing chamber cannot be inspected accurately either.

Figure 5:
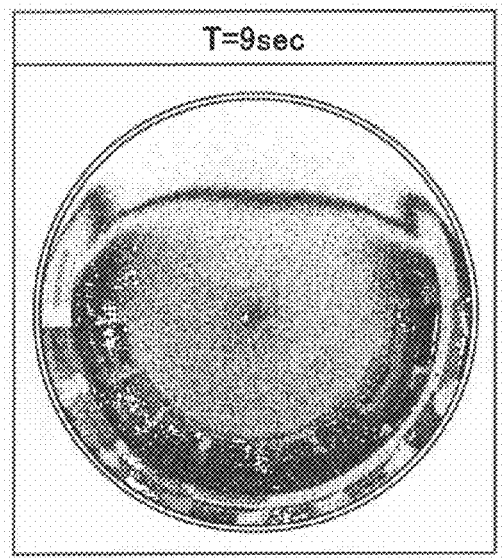
FIG. 5 presents the results of particle measurement executed by setting the purge delay time to 9 sec.

FIG. 5 presents the results of particle measurement executed to measure the quantity of particles on the test-piece wafer transferred into the measurement chamber 300 by closing the control valve (purge valve) V2 to stop the delivery of purge gas and opening the atmospheric pressure-side gate valve 152 at a time point t1 after allowing a purge delay time of 9 sec to elapse following the time point t0, at which the loadlock chamber achieved a pressure of 1 atmosphere, as shown in FIG. 4. FIG. 5 clearly indicates that a very large quantity of particles became adhered to the test-piece wafer.

Accordingly, in an attempt to address this problem, the inventor of the present invention et al. conducted an experiment by purging the loadlock chamber 150 with a dried inert gas and measuring the quantity of particles on test-piece wafers after varying lengths of purge delay time T. The inventor of the present invention et al. discovered through the experiment that when the length of purge delay time T was equal to or greater than a predetermined length, the quantity of particles assumed to have adhered onto the test-piece wafer during the transfer decreased drastically.

Figure 6:
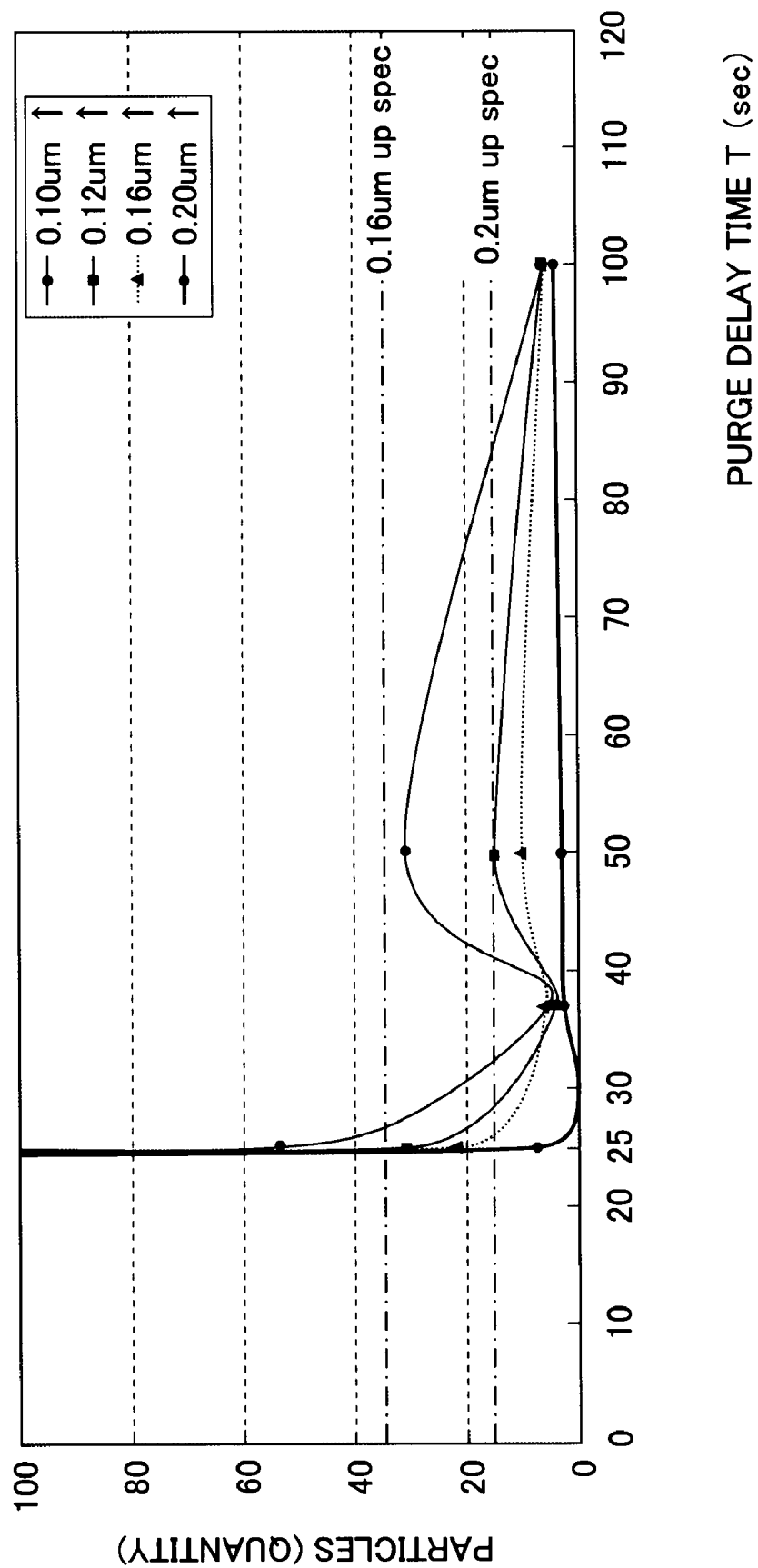
FIG. 6 shows the relationship between the purge delay time and the particle measurement results.
Figure 7:
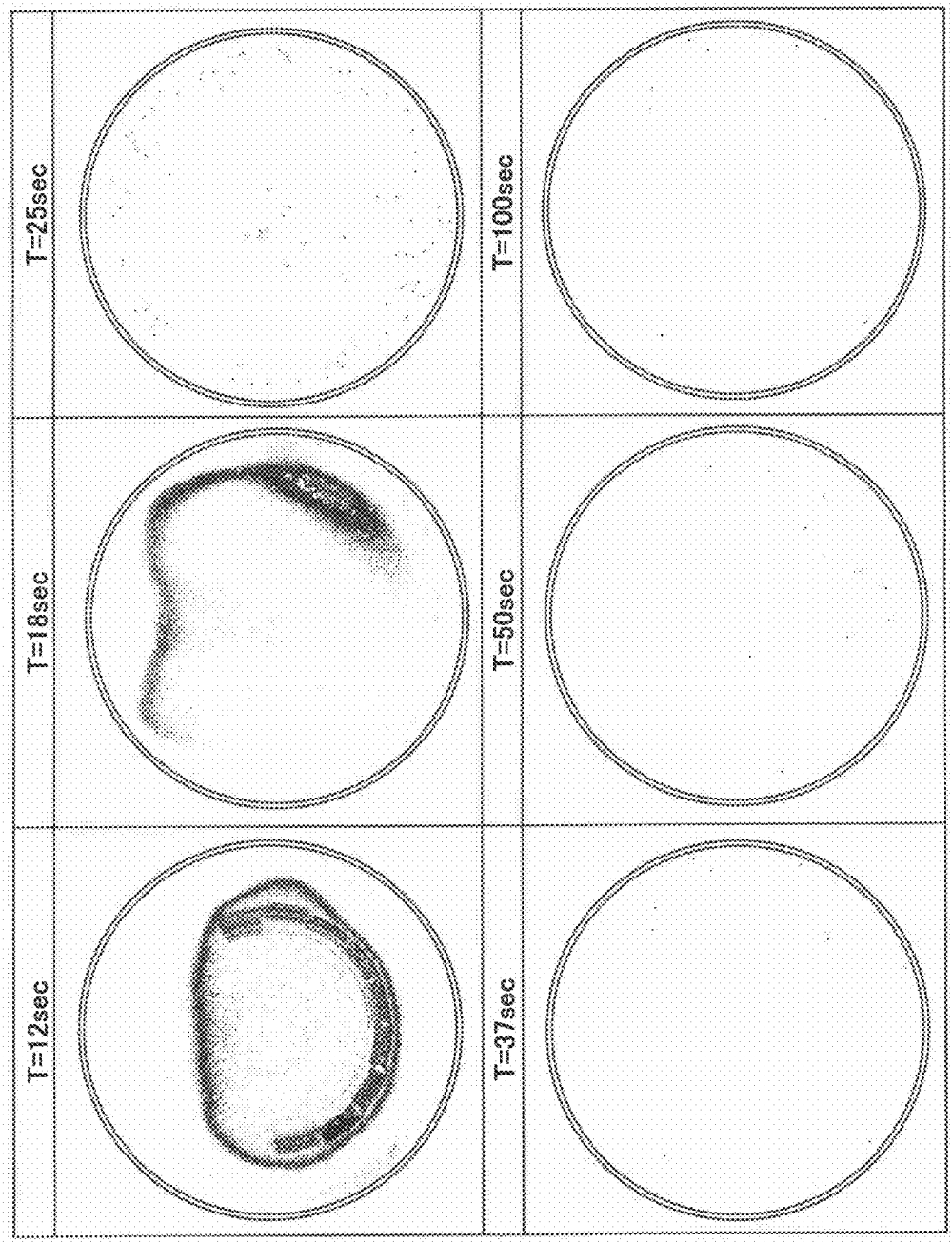
FIG. 7 presents the results of test-piece wafer particle measurements executed by setting the purge delay time to 12 sec, 18 sec, 25 sec, 37 sec, 50 sec and 100 sec.

The relationship between the length of the purge delay time T set for the purge of the loadlock chamber 150 executed by using the dried $N_2$ gas and the quantity of particles on the test-piece wafer is now explained in reference to drawings. FIG. 6 is a graph of the results of particle measurements executed to measure the quantity of particles on test-piece wafers by varying the length of the purge delay time T. FIG. 7 presents the results obtained by measuring the quantity of particles on test-piece wafers by setting the purge delay time T to 12 sec, 18 sec, 25 sec, 37 sec, 50 sec and 100 sec.

FIG. 6 indicates that when the purge delay time T was less than 25 sec, the quantities of particles were very significant at 100 or more, as substantiated by the measurement results corresponding to the 12 sec purge delay time and the 18 sec-purge delay time in FIG. 7. However, as the purge delay time T reached 25 sec, the quantity of particles started to decrease drastically and beyond the 25 sec-cutoff point, the quantities of particles decreased substantially in reverse proportion to the length of the purge delay time T.

When the acceptable ranges of particle increases on test-piece wafers are set to 35 or fewer for particles 0.16 μm or more in size and 15 or fewer for particles 0.20 μm or more in size, the quantities of particles measured after the purge delay time T of up to 25 sec were beyond the acceptable ranges, but once the purge delay time length T reached 25 sec, the quantities of particles were within the allowable ranges.

Accordingly, by setting the purge delay time T allowed for the purge of the loadlock chamber 150 executed with the dried inert gas to 25 sec or longer, the extent of increase in the quantity of particles assumed to be attributable to the moisture contained in the room air can be kept within the acceptable range. This, in turn, enables accurate measurement of the quantity of particles having become adhered onto the test-piece wafer within the processing chamber 202 during the processing. In addition, the increase in particles can be minimized simply by selecting a greater length for the purge delay time T. It is to be noted that while the particle increase can be prevented more reliably by setting a greater length of time for the purge delay time T, a purge delay time length of approximately 50 sec is optimal in practical application so as to assure good test-piece wafer throughput.

(Test Processing Executed by Using $N_2$ Gas and Increase in the Quantity of Particles on the Test-Piece Wafer)

Tests conducted by the inventor of the present invention et al. confirmed that even when the purge delay time T for the purge of the loadlock chamber 150 executed by using the dried inert gas is set to a great length (e.g., 50 sec), an increase in the quantity of particles on the test-piece wafer occurs immediately after the test processing is executed on the test-piece wafer or after the test-piece wafer having been returned to the cassette container is left in the cassette container over a specific length of time or more, depending upon the type of processing gas used in the test processing (e.g., a processing gas containing a fluorocarbon gas and $N_2$ gas).

The test results presented in FIG. 8 were obtained by executing test processing constituted with first through third steps described later on a test-piece wafer with a processing gas containing $N_2$ gas in a plasma processing device 200 such as that shown in FIG. 3, and measuring the quantities of particles on the test-piece wafer prior to the test processing, immediately after the test processing and two hours after the test processing. In addition, for purposes of comparison, the quantities of particles on a test-piece wafer were measured in a similar manner by executing the test processing (the first through third steps) with a processing gas having no $N_2$ gas content (with the flow rate of the $N_2$ gas set to 0) and the measurement results are presented in FIG. 9.

Figure 8:
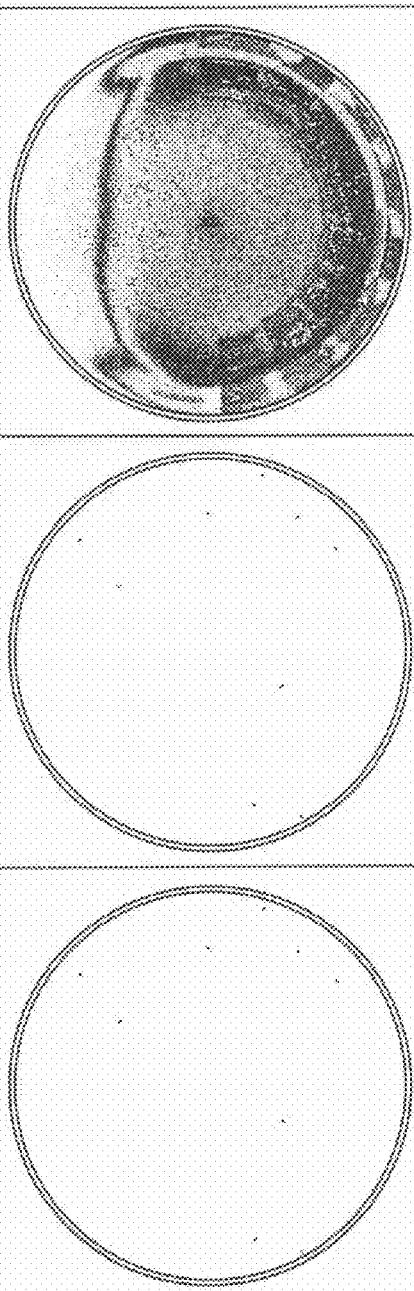
FIG. 8 presents the results of particle measurement following test processing executed by using a processing gas containing $N_2$ gas.

In the test processing executed in the tests, the results of which are presented in FIG. 8, plasma processing was executed in the first step by using $CF_4$ gas as the processing gas, plasma processing was executed in the second step by using a mixed gas containing $CHF_3$ gas, $CF_4$ gas, Ar gas and $N_2$ gas as the processing gas and plasma processing was executed in the third step by using a mixed gas containing $C_4F_8$ gas, Ar gas and $N_2$ gas as the processing gas. The processing conditions under which the first through third steps were executed are summarized below. It is to be noted that the upper electrode temperature, the lower electrode temperature and the side wall temperature were respectively set to 60° C., −10° C. and 60° C. in the first through third steps. In the tests, the results of which are presented in FIG. 9, the test processing was executed under identical processing conditions except that the gas flow rate of the $N_2$ gas was set to 0 for the second step and the third step.

(Processing Conditions for the First Step)

Processing gas: $CF_4$ gas

Processing chamber internal pressure: 98 mT (13.0 Pa)

High-frequency power applied to the upper electrode: 300 W

High-frequency power applied to the lower electrode: 300 W

Processing time: 10 sec (Processing Conditions for the Second Step)

Processing gas: $CHF_3$ gas, $CF_4$ gas, Ar gas, $N_2$ gas

Processing chamber internal pressure: 30 mT (4.0 Pa)

High-frequency power applied to the upper electrode: 500 W

High-frequency power applied to the lower electrode: 1000 W

Processing time: 10 sec (Processing Conditions for the Third Step)

Processing gas: $C_4F_8$ gas, Ar gas, $N_2$ gas

Processing chamber internal pressure: 50 mT (6.6 Pa)

High-frequency power applied to the upper electrode: 500 W

High-frequency power applied to the lower electrode: 2000 W

Processing time: 10 sec

In addition, the test processing was executed by altering some conditions with regard to the first through third steps and the quantities of particles on test-piece wafers were measured as described above prior to the test processing, immediately after the test processing and two hours after the test processing.

More specifically, in order to clarify the specific relationships between the test processing results and the individual steps, the quantities of particles on test-piece wafers were measured by executing the first step alone for 30 sec (test 1), executing the second step alone for 30 sec (test 2) and executing the third step alone for 30 sec (test 3).

Also, in order to clarify the relationship between the test processing results and the types of gases used in the test processing, the quantities of particles on test-piece wafers were measured by executing the first through third steps without using any $CF_4$ gas (test 4), executing the first through third steps without using any $CHF_3$ gas (test 5), executing the second step alone without using any $CHF_3$ gas (test 6), executing the second step alone without using any $N_2$ gas (test 7) and executing the third step alone without using any $N_2$ gas (test 8).

The results of these confirmation tests 1 through 8 are listed in Table 1 below. Table 1 presents the results of evaluation of the measurement of the quantities of particles on the test-piece wafers executed immediately after the test processing and two hours after the test processing, obtained through the tests 1 through 8. Acceptable ranges for the extent of particle increase on test-piece wafers were set to 35 or fewer for particles 0.16 µm or more in size and 16 or fewer for particles 0.20 µm or more in size. If the particle measurement results obtained immediately after or two hours after the test processing were within the acceptable ranges, the results were evaluated as "OK", whereas if the results were outside the acceptable ranges, they were evaluated as "NG".

TABLE 1

| CONFIR-MATION TEST | TEST PROCESSING | IMMEDIATELY AFTER PROCESSING | TWO HOURS AFTER PROCESSING |
|---|---|---|---|
| 1 | FIRST STEP ALONE (30 sec) | OK | OK |
| 2 | SECOND STEP ALONE (30 sec) | NG | NG |
| 3 | THIRD STEP ALONE (30 sec) | OK | NG |
| 4 | FIRST THROUGH THIRD STEPS (without $CF_4$ gas) | OK | NG |
| 5 | FIRST THROUGH THIRD STEPS (without $CHF_3$ gas) | OK | NG |
| 6 | SECOND STEP ALONE (without $CHF_3$ gas) | OK | NG |
| 7 | SECOND STEP ALONE (without $N_2$ gas) | OK | OK |
| 8 | THIRD STEP ALONE (without $N_2$ gas) | OK | OK |

(Test Result Evaluation)

As the test results presented in FIG. 8 indicate, only a few particles were present on the test-piece wafer having undergone the test processing constituted with the first through third steps described above executed by using a fluorocarbon gas containing $N_2$ gas and the quantities of particles hardly changed immediately after the test processing relative to the quantities measured before the test processing. However, two hours after the test processing, the quantities of particles increased drastically, substantially beyond the range (500 K particles) within which particles can be measured in the measurement chamber 300.

Figure 9:
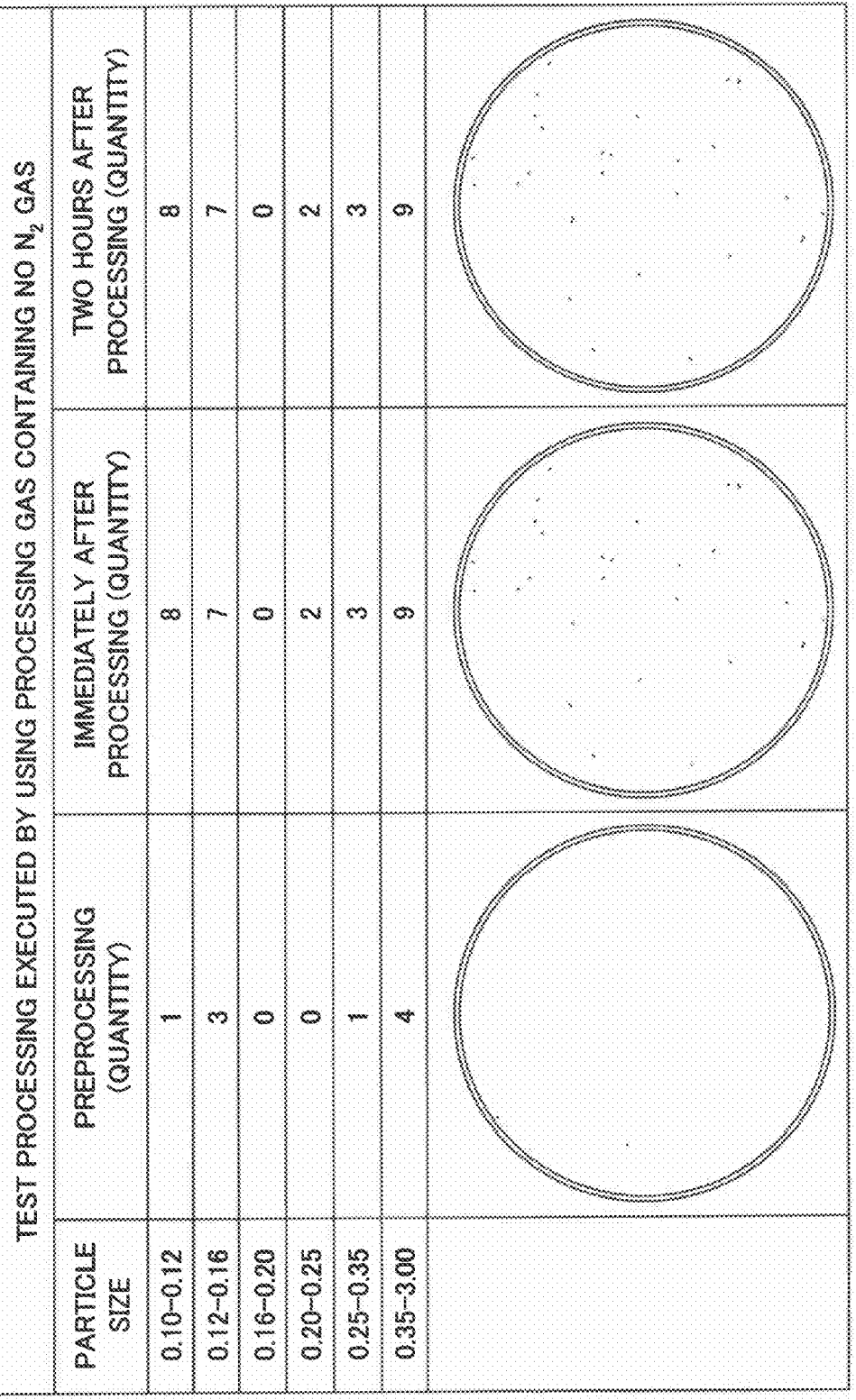
FIG. 9 presents the results of particle measurement following test processing executed by using a processing gas containing no $N_2$ gas.

As the test results presented in FIG. 9 indicate, only a few particles were present on the test-piece wafer having undergone the test processing constituted with the first through third steps described above executed by using a fluorocarbon gas containing no $N_2$ gas and the quantities of particles hardly changed immediately after the test processing relative to the quantities measured before the test processing. Furthermore, even two hours after the processing, the quantities of particles hardly increased.

In addition, the test results presented in Table 1 with regard to the relationship between the individual steps of the test processing and the particle measurement results indicate that while the particle measurement results from the measurement executed two hours after the test processing in test 1, in which the first step was executed without using $N_2$ gas, showed quantities of particles within the acceptable ranges, the quantities of particles measured in tests 2 and 3 after executing the second step alone and the third step alone with the processing gases containing $N_2$ gas increased beyond the acceptable ranges.

The test results presented in Table 1 with regard to the relationship between the type of gas used in the test processing and the particle measurement results indicate that while the quantities of particles measured two hours after the test processing executed without $CF_4$ gas or $CHF_3$ gas (test 4 through 6) increased beyond the acceptable ranges, the quantities of particles measured two hours after the test processing executed without $N_2$ gas (test 7 and 8) were within the acceptable ranges without manifesting any marked particle increases. The test results presented in FIGS. 8 and 9 and Table 1 all indicate that the increase in the quantity of particles measured two hours after the test processing is likely to be caused by the $N_2$ gas.

It is to be noted that the test results in Table 1 also indicate that when the second step alone was executed by using a processing gas containing $CHF_3$ gas (test 2), the quantity of particles measured immediately after the test processing showed an increase beyond the acceptable ranges as well as the quantities of particles measured two hours after the test processing, the quantities of particles measured immediately after the test processing executed without using $CHF_3$ gas (test 5 and 6) remained within the acceptable ranges although the quantities measured two hours after the test processing exceeded the acceptable ranges. These findings allow us to surmise that the increase in the quantity of particles accelerates even immediately after the test processing executed by using a processing gas containing $CHF_3$ gas as well as $CF_4$ gas and $N_2$ gas.

The test results described above indicate that when the fluorocarbon gas contains $N_2$ gas, large quantities of particles are collected on test-piece wafers after a certain length of time (e.g., two hours) following the processing. The main cause of this formation of particles in great quantities is assumed to be a chemical reaction such as that expressed in chemical expression (1) below occurring during the plasma processing, i.e., the test processing, executed by using the processing gas containing a fluorocarbon gas (e.g., a CF-containing gas ($C_xF_y$), a CHF-containing gas (hydrofluorocarbon gas; $C_pH_qF_r$, or the like) and $N_2$ gas, which forms $NH_3$ on the test-piece wafers.

A natural oxide film $SiO_2$ is normally formed on test-piece wafers, with the moisture ($H_2O$) in the atmosphere collected onto the hydrophilic $SiO_2$. The presence of the moisture further promotes the reaction expressed in chemical expression (1) during the plasma processing and also induces chemical reactions such as those expressed in chemical expressions (2) through (4) below causing the $NH_3$ formed on the test-piece wafers to react with, for instance, the halogen gas component (F) resulting in the formation of, for instance, halogen ammonia salt (e.g., $(NH_4)_2SiF_6$).

6H+N$_2$→2NH$_3$ (1)

NH$_3$+F→HF+NH$_2$ (2)

HF+NH$_3$→NH$_4$F (3)

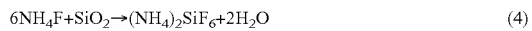

6NH$_4$F+SiO$_2$→(NH$_4$)$_2$SiF$_6$+2H$_2$O (4)

In addition, when the processing gas also contains a CHF-containing gas in addition to the CF-containing gas and the $N_2$ gas, the increased presence of H attributable to the CHF-containing gas promotes the reaction expressed in chemical expression (1) and, as a result, $NH_3$ tends to form in greater quantities. This, in turn, further promotes the chemical reactions in chemical expressions (3) and (4), which leads us to surmise that even immediately after the test processing, the formation of ammonia salt (e.g., $((NH_4)_2SiF_6)$ becomes accelerated.

The halogen type ammonia salt (e.g. $((NH_4)_2SiF_6)$ formed on the surface of the test-piece wafer gradually absorbs moisture ($H_2O$) in the atmosphere surrounding the test-piece wafer and particles are formed as time elapses. Namely, minute particles approximately 0.001 μm in size, too small to be measured even with an electron microscope, are initially formed and as time elapses, their quantity gradually increases and the size of the particles also gradually grows. After, for instance, one hour, they will have grown to approximately 0.1 μm in size and after approximately 24 hours, they may have grown as large as 0.5~0.7 μm in size. This leads us to the conclusion that the reaction with the moisture in the air causes the formation of particles in large quantities on the test-piece wafer after a certain length of time following the plasma processing.

It is to be noted that when the processing gas contains CHF gas as well as the CF-containing gas and the $N_2$ gas, ammonia salt (e.g., $(NH_4)_2SiF_6$) and moisture ($H_2O$) collect on the test-piece wafer at accelerated paces even immediately after the test processing and thus, particles increase at an accelerated pace even immediately after the test processing as well as after a specific length of time following the test processing, as the ammonia salt absorbs the moisture.

In contrast, if a fluorocarbon gas without any $N_2$ gas content is used, the chemical reaction in chemical expression (1), for instance, hardly occurs and thus, no increase in $NH_3$ resulting from the chemical reaction occurs, either. Consequently, the reactions in chemical expressions (3) and (4) hardly occur and hardly any ammonia salt is formed. Thus, it is assumed that if a fluorocarbon gas with no $N_2$ gas content is used, an increase in the quantities of particles on the test-piece wafer does not occur.

As explained above, an increase in the quantity of particles was observed on a test-piece wafer having undergone the test processing executed by using a processing gas containing a fluorocarbon gas and $N_2$ gas immediately after the test processing or after the test-piece wafer was left back in the cassette container 134 over a certain length of time or more. This means that, if a QC check is executed by first returning a test-piece wafer having undergone the test processing in the processing chamber 202 into the cassette container and carrying it into the measurement chamber 300 for particle measurement after a specific length of time or more, an excessive increase in the quantity of particles on the test-piece wafer undergoing the particle measurement in the measurement chamber 300 may disable accurate assessment of the state inside the processing chamber 202.

Accordingly, a treatment process is executed in the present invention by executing plasma processing with a processing gas constituted with $CF_4$ gas in immediate succession after test processing executed with a processing gas containing a fluorocarbon gas and $N_2$ gas. Since the ammonia component present on the test-piece wafer can be eliminated through the treatment process, an increase in the quantities of particles two hours after the test processing can be minimized.

Figure 10:
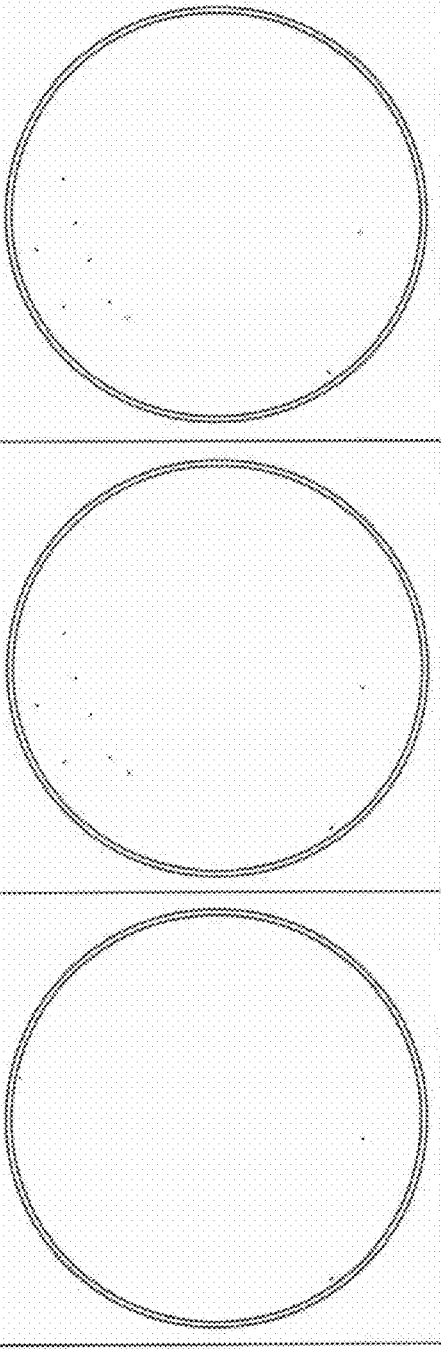
FIG. 10 presents the results of particle measurement following a treatment process executed by using $CF_4$ gas after the test processing.

FIG. 10 presents the test results of particle measurements executed to measure the quantities of particles on a test-piece wafer prior to the sequence of processing immediately after the processing sequence and two hours after the processing sequence by executing plasma processing as the treatment process with a processing gas constituted with $CF_4$ gas in immediate succession after the first through third steps described earlier executed as the test processing with a processing gas containing a fluorocarbon gas and $N_2$ gas. The treatment process was executed under the following processing conditions for the tests, the results of which are presented in FIG. 10.

(Processing Conditions for the Treatment Process)

Processing gas: $CF_4$ gas

Processing chamber internal pressure: 100 mT (13.3 Pa)

High-frequency power applied to the upper electrode: 500 W

High-frequency power applied to the lower electrode: 600 W

Processing time: 10 sec

The test results presented in FIG. 10 indicate that hardly any increase in the quantity of particles on the test-piece wafer was observed immediately after the treatment process or two hours after the treatment process. During the treatment process, the surface of the test-piece wafer is exposed to plasma generated from the $CF_4$ gas with no $N_2$ gas content and thus, even if $NH_3$ is formed, a chemical reaction such as that expressed in, for instance, chemical expression (2) tends to progress readily, as explained earlier. Through the chemical reaction, $NH_3$ is consumed in greater quantity, and thus, hardly any reactions expressed in chemical expressions (3) and (4) occur, minimizing the formation of ammonia salt. In addition, the heat from the plasma generated during the treatment process decomposes the ammonia salt itself through a chemical reaction such as that expressed in chemical expression (5), promoting the elimination of the ammonia salt.

$$(NH_4)_2SiF_6 \rightarrow NH_3 + HF + SiF_4 \qquad (5)$$

It is desirable that the processing conditions for the treatment process other than the type of processing gas (e.g., the levels of high-frequency power applied to the individual electrodes) be selected by ensuring that the test-piece wafer does not become etched. By selecting such processing conditions, the ammonia component having become adhered onto the test-piece wafer can be removed without damaging the test-piece wafer. In addition, a fluorocarbon gas other than the $CF_4$ gas may be used as the processing gas.

The fluorocarbon gases that may be used as the processing gas include CF gases ($C_xF_y$) such as $C_4F_6$ gas, $C_5F_8$ gas and $C_4F_8$ gas as well as the $CF_4$ gas and CHF gas (hydrofluorocarbon gases; $C_pH_qF_r$) such as $CHF_3$ gas. In addition, a mixed gas containing different types of fluorocarbon gases in combination may be used as the processing gas in the treatment process as long as it does not contain any $N_2$ gas. Since the ammonia component having become adhered on to the test-piece wafer can be removed through the treatment process executed by using any of such fluorocarbon gases and, as a result, the increase in the quantity of particles on the test-piece wafer can be minimized.

While an explanation is given above on an example in which the quantity of particles on a test-piece wafer having undergone the test processing executed by using a processing gas containing a fluorocarbon gas and $N_2$ gas increases immediately after the test processing or after a certain length of time elapses following the test processing, the present invention may be adopted in conjunction with wafers other than test-piece wafers. For instance, the treatment process described above may be executed in immediate succession following wafer processing executed with a processing gas containing a fluorocarbon gas and $N_2$ on a product wafer if the quantity of particles on the product wafer would otherwise increase immediately after the wafer processing or after a certain length of time following the wafer processing.

In addition, the particles may be reduced either by setting a great length of time for the purge delay time T for the purge of the loadlock chamber 150 executed with the dried inert gas or through the treatment process, or the particles may be reduced by combining these two methods.

It is to be noted that the present invention may be adopted in any of various other types of substrate processing apparatuses as well as in the substrate processing apparatus shown in FIG. 1. For instance, the present invention may be adopted in a substrate processing apparatus equipped with a multi-chamber vacuum processing unit that includes a plurality of processing chambers connected around a common transfer chamber where a transfer mechanism is installed.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

What is claimed is:

1. A substrate processing apparatus inspection method to be adopted in a substrate processing apparatus comprising a processing chamber where a specific type of processing is executed on a substrate placed on a stage with the temperature thereof set at a low level equal to or lower than 0° C. in a vacuum atmosphere;
    a loadlock chamber connected to said processing chamber and a transfer chamber, connected to said loadlock chamber through which the substrate is transferred at a pressure of one atmosphere, when inspecting the state inside said processing chamber by measuring particles on a test-piece substrate having undergone a specific type of test processing inside said processing chamber, wherein:
    the test-piece substrate having been processed in said processing chamber is transferred back into said transfer chamber via said loadlock chamber after holding the test-piece substrate in said loadlock chamber over a predetermined length of time while delivering a dried inert gas into said loadlock chamber; and
    said predetermined length of time is set to a length of time at which an increase in the particles on the test-piece substrate can be kept within an acceptable range, wherein
    said test processing is executed by using a processing gas containing at least a fluorocarbon gas and $N_2$ gas, a treatment process is executed immediately after said test processing by using a processing gas containing a fluorocarbon gas with no $N_2$ gas content, and
    a pressure inside said processing chamber and a high-frequency power applied to a lower electrode during said treatment process are set to levels at which the substrate is not etched.

2. A substrate processing apparatus inspection method according to claim 1, wherein:
    said predetermined length of time is set to 25 seconds or more.

3. A substrate processing apparatus inspection method according to claim 1, wherein:
    the temperature of said stage is set to −10° C. or lower.

4. A substrate processing apparatus inspection method according to claim 1, wherein:
    the inert gas is $N_2$ gas.

5. A substrate processing apparatus inspection method according to claim 1, wherein:

said fluorocarbon gas used in said treatment process is $CF_4$ gas.

6. A method for reducing quantity of particles on a substrate, adopted in a substrate processing apparatus that includes a processing chamber where a specific type of plasma processing is executed on a substrate placed on a lower electrode with the temperature thereof set at a low level of 0° C. or lower by supplying high-frequency power to the lower electrode within a vacuum atmosphere, when reducing the quantity of particles on the substrate having undergone plasma processing executed with a processing gas containing at least a fluorocarbon gas and $N_2$ gas, wherein:

a treatment process is executed by using a processing gas containing a fluorocarbon gas with no $N_2$ gas content immediately after the specific type of processing executed in said processing chamber, wherein a pressure inside said processing chamber and the high-frequency power applied to said lower electrode during said treatment process are set to levels at which the substrate is not etched.

7. A method for reducing quantity of particles on a substrate according to claim 6, wherein:

said fluorocarbon gas used in said treatment process is $CF_4$ gas.

* * * * *